(12) United States Patent
Singer

(10) Patent No.: US 6,459,274 B1
(45) Date of Patent: Oct. 1, 2002

(54) METHODS AND APPARATUS FOR TESTING ELECTRICAL CONNECTIONS

(76) Inventor: Nathan Singer, 8640 NW. 53rd St., Tamarac, FL (US) 33321

( * ) Notice: Subject to any disclaimer, the term of this patent is extended or adjusted under 35 U.S.C. 154(b) by 0 days.

(21) Appl. No.: 09/616,502

(22) Filed: Jul. 14, 2000

(51) Int. Cl.⁷ .................................................. H01H 31/04
(52) U.S. Cl. ...................... 324/538; 324/542; 324/543; 439/578
(58) Field of Search ................................ 324/72.5, 149, 324/158.5, 538, 133, 318, 425, 527, 539, 556, 542, 627, 543; 361/111; 439/638, 578, 585, 651, 675

(56) References Cited

U.S. PATENT DOCUMENTS

| | | | | |
|---|---|---|---|---|
| 3,656,072 A | * | 4/1972 | Ludwig | 333/260 |
| 4,118,105 A | * | 10/1978 | Voigt | 385/88 |
| 4,209,742 A | * | 6/1980 | Bender | 324/72.5 |
| 4,236,188 A | * | 11/1980 | Prochazka | 361/111 |
| 5,724,220 A | * | 3/1998 | Chandhry | 361/119 |
| 6,174,206 B1 | * | 1/2001 | Yentile | 439/638 |

\* cited by examiner

*Primary Examiner*—Michael Sherry
*Assistant Examiner*—Trung Nguyen
(74) *Attorney, Agent, or Firm*—Richard M Saccocio, Esq

(57) ABSTRACT

Methods and apparatus are presented for determining the adequacy of a shielding and an electrical connection of a male BNC to a coaxial cable. A dial indicator gauge includes a calibration member for calibrating the limits of a properly connected male BNC. A simulated female BNC is included with the gauge. The calibrated gauge is attached to the male BNC connection which then indicates whether the connection is within the allowable limits.

11 Claims, 2 Drawing Sheets

METHODS AND APPARATUS FOR TESTING ELECTRICAL CONNECTIONS

BACKGROUND OF THE INVENTION

1. Field of the Invention

This invention relates in general to the field of electrical wire connections and in particular to methods and apparatus for determining the adequacy of an electrical connection of a coaxial cable to BNC connectors.

2. Description of the Prior Art

A coaxial cable comprises an inner or central conductor surrounded by an insulator which, in turn, is surrounded by a metal shield and finally, an outer layer of insulation surrounding the metal shield. In order to connect one end of a coaxial cable to an end of another coaxial cable, it is required that both the central conductor and the shielding be connected and such that a continuous shield covers the central conductor connection. The finished connection must also include insulation between the central conductor and the shielding.

Because of the complexity of a coaxial cable connection, and for purposes of making certain that a proper and adequate coaxial cable connection is made, special male and female fittings have been created. In the trade, these fittings are known as BNC connectors, or simply a BNC. For example a male fitting is referred to as a male BNC; similarly, a female fitting is referred to as a female BNC. In general, the BNC fittings provide for the ability of a technician to make coaxial cable connections under the difficult conditions usually associated with a connection in the field. In other words, the BNC fittings allow for connections to be made at the physical location were the coaxial cable is being routed with a degree of assurance that a good connection has been made.

Typically, when a coaxial cable connection is to be made, a male BNC is attached to each end of the coaxial cable to be connected. A female BNC is used to join the two male BNCs and make the electrical connection. The male BNCs provide for attaching a pin connector to the central conductor of the coaxial cable, inserting the cable and the pin attached thereto into the male BNC and crimping a sleeve portion of the BNC around the cable. The male BNC further provides for an extension of the shielding around the pin connector in accordance with the design of the male BNC.

The male BNC includes a spring-loaded camming device which allows the male BNC to be connected to the female BNC. A pair of lugs on an extending portion of the female BNC fit within grooves in the spring-loaded device. The spring-loaded device includes a cam surface which is then rotated to firmly lock the lugs to the spring-loaded device by the action of the cam on the lugs. This locks the male BNC to the female BNC. The pin within the male BNC frictionally fits within an opening within a sleeve in the female BNC to make the electrical connection. When the male and female BNCs are locked together, the male pin connector is locking connected to the opening within the female connector. When the male BNC, which is attached to the other end of the coaxial cable, is fitted to and locked with the opposite end of the female BNC, the connection between the central conductors is made. The shielding connection is simultaneously made when the male BNCs are joined to the female BNC interposed therebetween.

A critical aspect of joining two ends of a coaxial cable to each other is the relationship of the pin connector within the male BNC relative to the end of the shielding member within the male BNC so that central conductors are joined and the shielding connection are simultaneously made when the BNCs are locked together. To the extent possible, the design of the male BNC provides for this proper relative relationship but it is subject to the skill of the electrician when attaching the male BNC to the coaxial cable. An experienced electrician will generally properly prepare an end of a coaxial cable and attach a male BNC thereto, such that the combination of his or her skill together with the design of the male BNC will result in the proper relative relationship of the pin connector to the end of the shield within the BNC to achieve an electrically acceptable coaxial cable connection.

Notwithstanding the skill of the electrician and the design of the male BNC, there exists the distinct possibility that the relative position of the pin connector to the end of the shield member within an attached male BNC will not be proper. If the relationship is not proper, a less than satisfactory connection results which usually results in intermittent connections and disconnections. Intermittent connections are the most troubling types of failures. They do not lend themselves to easy detection or isolation. Even extensive field electrical testing might not uncover the problem because at the time of the test, an electrical connection might exist only to later become disconnected, as is the nature of intermittent connections. Then too, such failures might not occur immediately but rather some time later after the entire installation has been completed and the cable is not accessible.

What is needed then are methods and apparatus to allow a simple but effective field test to be performed immediately after a coaxial wire is attached to a male BNC in order to ensure that a proper electrical connection will result when all the BNCs are connected to each other. The present invention accomplishes this highly desirable objective.

BRIEF DESCRIPTION OF THE DRAWINGS

Various other objects, advantages, and features of the invention will become apparent to those skilled in the art from the following discussion taken in conjunction with the following drawings, in which.

DESCRIPTION OF THE PREFERRED EMBODIMENTS

Figure 1:
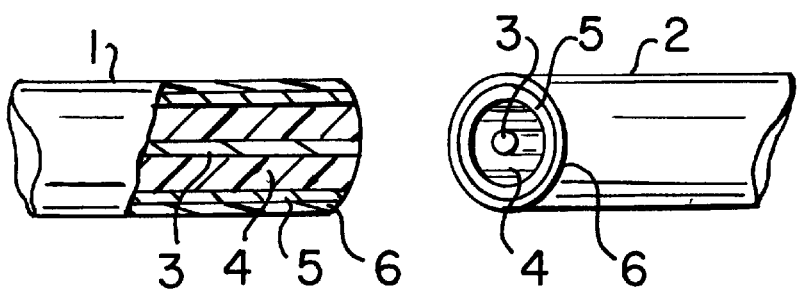
FIG. 1 is a cross-sectional view of two ends of a coaxial cable, which are to be joined by a BNC connector.

As required, detailed embodiments of the present invention are disclosed herein; however, it is to be understood that the disclosed embodiments are merely exemplary of the invention which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Reference is now made to the drawings, wherein like characteristics and features of the present invention shown in the various figures are designated by the same reference numerals.

FIGS. 1–4 schematically illustrate the prior art components which are being shown to assist one skilled in the art to have a full and complete understanding of the present invention. FIG. 1 illustrates, in cross section, two ends 1 and 2 of a coaxial cable, which are to be electrically joined together. The coaxial cable comprises a center conductor 3, insulation 4, shielding 5, and an outer covering of insulation 6.

Figure 2:
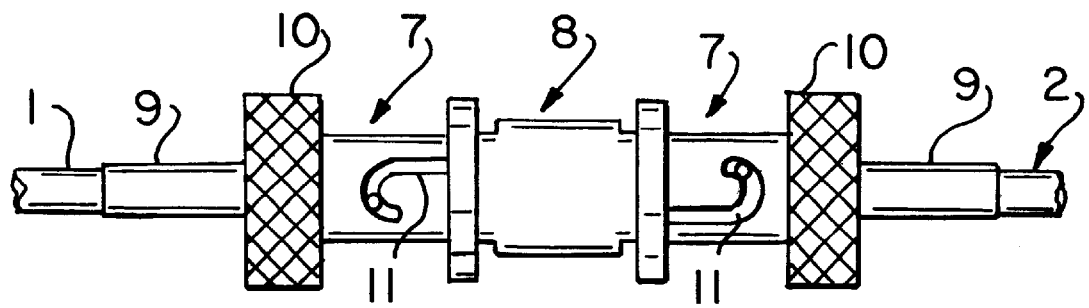
FIG. 2 is a typical connection of a coaxial cable using BNC connectors.

FIG. 2 schematically illustrates the coaxial cable ends of FIG. 1 being respectively joined by male BNC fittings 7 with a female BNC fitting 8 interposed therebetween. The male BNC fittings 7 include a crimping sleeve 9 and a knurled spring-loaded member 10, which includes a cam arrangement 11 which secures the male 7 to he female 8 BNC.

Figure 3:
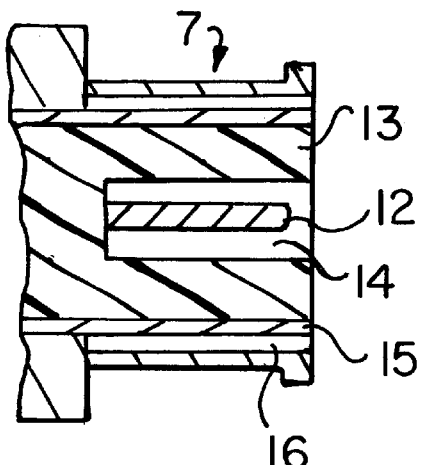
FIG. 3 is a partial, cross section of a prior art male BNC connector.

FIG. 3 illustrates, in cross section, the extending end of the male BNC 7. A male pin connector 12 is located at the center of the male BNC 7. Pin connector 12 is connected to the central conductor 3 of the end of the coaxial cable 1 which is to be joined to coaxial cable 2 as shown in FIG. 2. A layer of insulation 13 surrounds pin connector 12. An annular opening 14 immediately surrounding pin connector 12 is provided within insulation 13. A metal shield 15, comprising a cylindrical member, is provided around the outer circumference of insulation 13. Metal shield 15 is connected to the metal shield 5 of coaxial cable 1. Finally, the spring-loaded camming member 10 is fitted over metal shield 15 with an annular space 16 therebetween.

Figure 4:
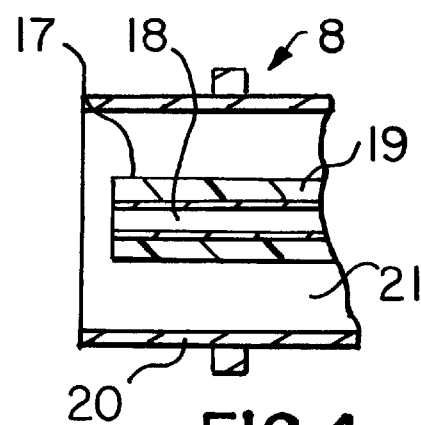
FIG. 4 is a partial, cross section of a prior art female BNC connector.

FIG. 4 illustrates, in cross section, an extending portion of the female 8 BNC which is to be joined with the male 7 BNC. A female pin connector 17 is located at the center of female BNC 8. Female pin connector 17 comprises a cylindrical member having an internal opening 18 sized to frictionally fit the male pin connector 12 therewithin and such that an electrical connection is made. A layer of insulation 19 surrounds female pin connector 17. A housing of the female BNC 8 includes a cylindrical portion 20 which surrounds the female pin connector 17 with an annular space 21 therebetween. A pair of lugs 22 are fitted to the female BNC 8 which cooperate with the spring-loaded camming member of male BNC 7 to cammingly lock the two together. In this regard, the cylindrical portion 20 of female BNC 8 fits within the annular space 16 of male BNC 7. At the same time, the male pin connector 12 is fitted within the opening 18 of the pin connector 17 and the end 23 of metal shield 15 contacts the flanged surface 24 of cylindrical portion 20 of female BNC 8. In this manner, the central male and female pin connectors are electrically connected and a full metal shield surrounds the pin connection when the male BNC 7 is connected to the female BNC 8.

Figure 5:
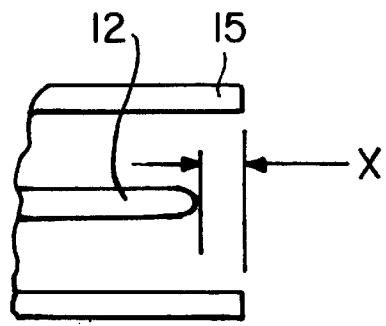
FIG. 5 is a schematic view of a portion of a male BNC connector showing the relative positions of the shield and pin connector.

As noted above, it is critical that the shielding connection be positively made when the male BNC is attached to the female BNC, and that this connection is, in turn, dependent upon the position of the end of the shield 15 relative to the end of the male pin connector 12. Should the field electrician not properly locate the end of the pin connector 12 relative to the shield 15, a faulty connection results. FIG. 5 schematically illustrates this relative configuration. Nominally, the dimension denoted by the reference "X" is to be between the range of 0.000 inches and 0.023 inches; however, in practicality, the relative distance should not be greater than 0.020 inches. If dimension "X" is between this range, a proper connection will be achieved. The present invention provides methods and apparatus to quickly and conveniently measure the dimension "X" in the field.

Figure 6:
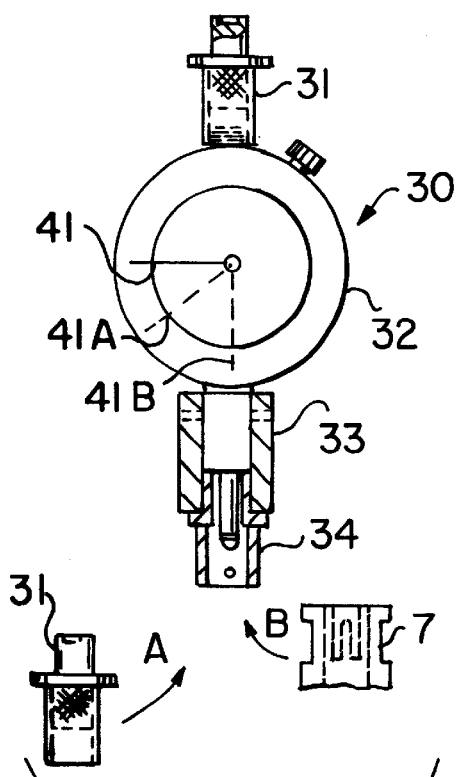
FIG. 6 is an assembly of the inventive pin depth gauge.
Figure 7:
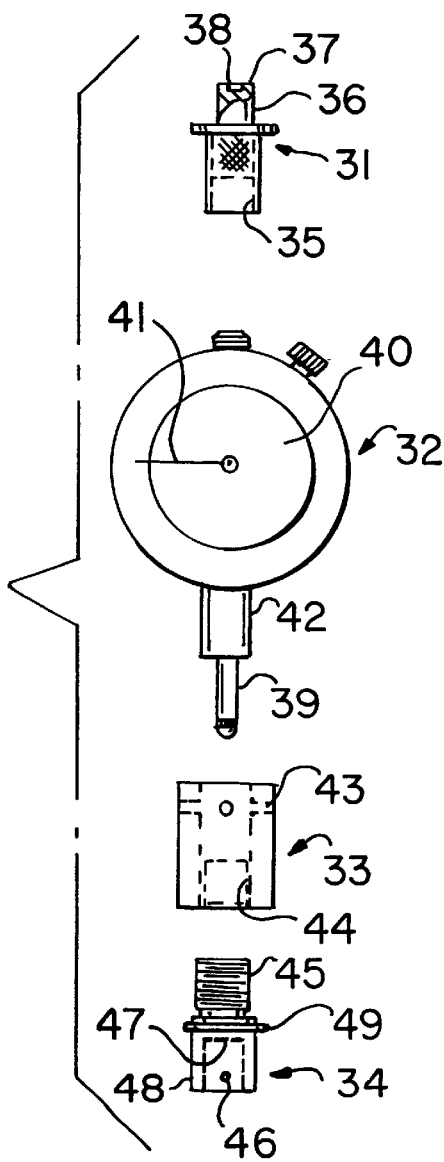
FIG. 7 is an exploded view of the components of the pin depth gauge of FIG. 6.

FIG. 6 shows an assembly of the pin depth gauge. FIG. 7 illustrates the individual components of FIG. 6. Pin depth gauge 30 comprises a calibration cap 31, a dial indicator gauge 32, a barrel member 33, and an interfacing female simulator 34. When the pin depth gauge is attached to a male connector 7 which is connected to a coaxial cable 1, the dial indicator will read the "X" dimension of an actual field connected male connector. If the reading is between 0.000 inches and 0.020 inches, the male connector has been properly connected. If the dial indicator reading is greater than 0.020 inches, the male connector has been improperly connected to the coaxial cable and a faulty connection will probably exist.

Calibration cap 31 comprises a cylindrical member having internal screw threads 35 at one end. The other end 36 includes a calibration configuration which comprises a top surface 37 and a spaced lower surface 38. The distance between top surface 37 and lower surface 38 is exactly 0.023 inches. The internal screw threads 35 are used to connect the calibration cap 31, when it is not being used, to the dial indicator.

The dial indicator 32 comprises a typical gauge for measuring a length difference between two surfaces as is known in the prior art. Movement of the plunger 39 is registered on the face 40 of the gauge by a dial 41. Preferably, the dial indicator 32 includes a rotatable dial face 40 which can be screw locked at a desired setting. A dial indicator 32 having approximately one-quarter inch of travel and reading in one thousands of an inch increments is satisfactory.

Barrel 33 comprises a cylindrical member which is attachable to the plunger housing 42 by, for example, set screws 43. Barrel 33 is internally threaded 44. Female BNC simulator 34 comprises yet another cylindrical member. External threads 45 provide for connection to the barrel 33. An external flange 45 limits the length that the female BNC simulator 34 is threaded into the barrel 33. The portion of the female BNC simulator 34, which extends from the barrel 33, approximates the external configuration of a female BNC 8 including lugs 46.

An internal flange 47 is spaced from the unthreaded end 48 of female BNC simulator 34 by a distance of approximately 0.045 inches less than the nominal depth of annular space 16 in male BNC 7. This is done to make certain that the unthreaded end 48 of the female BNC simulator does not bottom out when connected to male BNC 7. This allows the bottom surface of flange 47 to make positive contact with the end of metal shield 15 in male BNC 7.

In order to determine whether a field connected male BNC 7 has been properly attached to a coaxial cable by using the inventive apparatus 30, the following procedure is used. The calibration cap 31 is removed from its storage location on the top of the dial indicator 32 and inserted into the female BNC simulator 34 as indicated in FIG. 6. With the gauge plunger 39 depressed approximately one-eighth of an inch, and its end against the lower surface 38 of the calibration cap 31, moving the dial 41 to position 41a. Then, the dial face 40 is moved to coincide with the dial 41a showing a zero reading. The dial face 40 is locked in place and the calibration cap 31 is removed from gauge 32, which may then be relocated to its storage location on top of the gauge 32. The pin depth gauge 30 is now ready to be used to test male BNCs 7.

The male BNC 7 to be tested is assembled to the female BNC simulators 34 using the camming mechanism of the male BNC 7 as seen in FIG. 6. The dial gauge 32 will now automatically read or indicate the depth of the male pin connector 12 relative to the outermost or top surface of the metal shield 15 and in so doing, cause the dial to move to position 41b. A reading of 0.000 to minus 0.010 inches is preferred; a reading of 0.000 to minus 0.020 inches is acceptable. Any other reading is not acceptable. The test is thus simple, quick, and accurate, and can save untold hours and monies which would otherwise be spent to attempt to locate a faulty connection.

While the invention has been described, disclosed, illustrated and shown in certain terms or certain embodiments or modifications which it has assumed in practice, the scope of the invention is not intended to be nor should it be deemed to be limited thereby and such other modifications or embodiments as may be suggested by the teachings herein are particularly reserved especially as they fall within the breadth and scope of the claims here appended.

What is claimed is:

1. A method for measuring the distance between a pin member and a shielding member of a male BNC when connected to a coaxial cable, comprising the steps of:

attaching a simulated female BNC to a dial indicator gauge;

positioning a calibration member against the simulated female BNC such that a plunger of the dial indicator contacts a reference surface on said calibration member;

reading the dial indicator a first time;

removing said calibration member;

attaching a male BNC to said simulated female BNC;

reading the dial indicator a second time; and determining the difference between the two readings.

2. The method of claim 1, including the step of zeroing the reading on the dial indicator with the dial thereof during said first reading.

3. The method of claim 1, including the step of accepting the male BNC for use with the coaxial cable if the difference between readings is 0.023 inches or less.

4. The method of claim 1, including the step of rejecting the male BNC for use with the coaxial cable if the difference between readings is greater than 0.023 inches.

5. Apparatus adapted to be attached to a male BNC that is connected to a coaxial cable, said male BNC having a pin connector and a shielding member, comprising:

a dial indicator gauge having a plunger attached thereto;

a calibration member adapted to be in contact with said plunger, said calibration member having a reference surface thereon for contact with said plunger; and a simulated female BNC attachable to said plunger.

6. The apparatus of claim 5, including an interfacing barrel member attached to said plunger, said simulated female BNC being attached to said barrel member.

7. The apparatus of claim 6, wherein said calibration member is adapted to be positioned against said simulated female BNC.

8. The apparatus of claim 7, wherein the simulated female BNC includes lugs for attaching said male BNC thereto.

9. The apparatus of claim 7, wherein said simulated female BNC is configured to include an internal reference surface for contacting the shield of the male BNC when the male BNC is attached thereto.

10. The apparatus of claim 6, wherein the dial indicator gauge includes a sleeve covering a portion of the plunger, said barrel member being attached to said sleeve.

11. The apparatus of claim 5, wherein the calibration member includes means for attaching the calibration member to the dial indicator gauge when the calibration member is not in use.

* * * * *